United States Patent
Abe et al.

(10) Patent No.: US 8,941,002 B2
(45) Date of Patent: Jan. 27, 2015

(54) OXIDE EVAPORATION MATERIAL, VAPOR-DEPOSITED THIN FILM, AND SOLAR CELL

(75) Inventors: Yoshiyuki Abe, Tokyo (JP); Riichiro Wake, Tokyo (JP); Masakazu Kuwahara, Tokyo (JP); Kentaro Sogabe, Tokyo (JP); Azusa Oshiro, Tokyo (JP); Hisaki Yada, Tokyo (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 378 days.

(21) Appl. No.: 13/520,640

(22) PCT Filed: Jan. 7, 2011

(86) PCT No.: PCT/JP2011/050589
§ 371 (c)(1),
(2), (4) Date: Jul. 5, 2012

(87) PCT Pub. No.: WO2011/089984
PCT Pub. Date: Jul. 28, 2011

(65) Prior Publication Data
US 2012/0279564 A1 Nov. 8, 2012

(30) Foreign Application Priority Data

Jan. 25, 2010 (JP) .................. 2010-013313

(51) Int. Cl.
*H01B 1/08* (2006.01)
*H01L 31/0224* (2006.01)
(Continued)

(52) U.S. Cl.
CPC ........ *H01L 31/022466* (2013.01); *C04B 35/01* (2013.01); *C04B 35/6261* (2013.01); *C04B 35/638* (2013.01); *C23C 14/086* (2013.01); *C23C 14/24* (2013.01);
(Continued)

(58) Field of Classification Search
USPC .................. 136/250, 252, 256, 258; 252/512, 252/518.1; 428/64.1; 423/593.1
See application file for complete search history.

(56) References Cited

FOREIGN PATENT DOCUMENTS

| JP | 8-85866 | 4/1996 |
|---|---|---|
| JP | 8-85867 | 4/1996 |

(Continued)

OTHER PUBLICATIONS

JP 2007112673 A, Nakayama et al. Japan May 2007, machine translation.*

(Continued)

*Primary Examiner* — Susan D Leong
(74) *Attorney, Agent, or Firm* — Kratz, Quintos & Hanson, LLP

(57) ABSTRACT

Provided are an oxide tablet for vapor deposition (oxide evaporation material), and a vapor-deposited thin film and a solar cell formed using the same. The tablet comprises a sintered body which contains indium oxide as a main component and cerium and which is subjected to no surface grinding after sintering, in which $Comp^S/Comp^A = 0.9$ to 1.1, where the content of cerium in a surface layer to a depth of 5 μm from a surface of the sintered body is represented by a Ce/In atomic ratio ($Comp^S$), and an average value of the content of cerium in the entire sintered body is represented by a Ce/In atomic ratio ($Comp^A$).

16 Claims, 1 Drawing Sheet

(51) Int. Cl.
*C04B 35/01* (2006.01)
*C04B 35/626* (2006.01)
*C04B 35/638* (2006.01)
*C23C 14/08* (2006.01)
*C23C 14/24* (2006.01)
*H01L 31/0392* (2006.01)
*H01L 31/0749* (2012.01)

(52) U.S. Cl.
CPC ..... *H01L 31/03923* (2013.01); *H01L 31/0749* (2013.01); *C04B 2235/3229* (2013.01); *C04B 2235/3286* (2013.01); *C04B 2235/656* (2013.01); *C04B 2235/6562* (2013.01); *C04B 2235/6565* (2013.01); *C04B 2235/6567* (2013.01); *C04B 2235/6585* (2013.01); *C04B 2235/6586* (2013.01); *C04B 2235/75* (2013.01); *C04B 2235/77* (2013.01); *Y02E 10/541* (2013.01)

USPC ....... 136/256; 252/512; 252/518.1; 428/64.1; 423/593.1

(56) References Cited

FOREIGN PATENT DOCUMENTS

| JP | 9-176841 | | 7/1997 |
| JP | 2004-43851 | A1 | 2/2004 |
| JP | 2005-242264 | A1 | 9/2005 |
| JP | 2005-290458 | A1 | 10/2005 |
| JP | 2007112673 | A * | 5/2007 |

OTHER PUBLICATIONS

International Search Report for International Application No. PCT/JP2011/050589 dated Mar. 29, 2011.

\* cited by examiner

SOLAR RAY

SOLAR RAY

SOLAR RAY

OXIDE EVAPORATION MATERIAL, VAPOR-DEPOSITED THIN FILM, AND SOLAR CELL

TECHNICAL FIELD

The present invention relates to an oxide evaporation material to be used to form transparent conductive films and high-refractive-index optical films by various vacuum vapor deposition methods such as electron beam deposition, ion plating, and high-density plasma-assist evaporation, a vapor-deposited thin film such as a transparent conductive film or an optical film formed using the oxide evaporation material, and a solar cell using the transparent conductive film as an electrode. In particular, the present invention relates to the improvement of an oxide evaporation material which comprises a sintered body containing indium oxide as a main component and cerium and which is subjected to no surface grinding after sintering, and a vapor-deposited thin film and a solar cell formed using the oxide evaporation material.

BACKGROUND ART

Transparent conductive films have high electrical conductivities and high transmittances in the visible light region. Further, transparent conductive films are utilized as electrodes and the like of solar cells and liquid crystal display devices as well as various kinds of light receiving elements, making use of the above-described properties thereof. Furthermore, transparent conductive films are also utilized as heat ray reflection films for use in window glass and the like of automobiles and buildings, various kinds of antistatic films, and transparent heating members for preventing fog for freezer showcases and the like, making use of reflection and absorption properties thereof in the near-infrared region.

Moreover, in the transparent conductive films, tin oxide ($SnO_2$) containing antimony or fluorine as a dopant, zinc oxide (ZnO) containing aluminum, gallium, indium, or tin as a dopant, indium oxide ($In_2O_3$) containing tin, tungsten, or titanium as a dopant, and the like are generally broadly utilized. In particular, indium oxide films containing tin as a dopant, i.e., $In_2O_3$—Sn-based films, are called ITO (Indium tin oxide) films, and have been widely industrially used heretofore because low-resistance transparent conductive films can be easily obtained.

Further, as processes for forming such transparent conductive films, vacuum vapor deposition processes, sputtering processes, processes in which a coating fluid for forming a transparent conductive layer is applied, and the like are generally used. Of these processes, vacuum vapor deposition and sputtering processes are effective approaches for the case where a material having a low vapor pressure is used or where precise film thickness control is needed, and are industrially useful because operation is very easy. Moreover, in comparison between vacuum vapor deposition and sputtering processes, vacuum vapor deposition processes can form films faster, and are therefore superior in terms of mass productivity.

In general, vacuum vapor deposition is a process in which a solid or liquid as an evaporation source is once decomposed into gas molecules or atoms by heating in a vacuum of approximately $10^{-3}$ to $10^{-2}$ Pa, and then the gas molecules or atoms are condensed on a surface of a substrate as a thin film again. Moreover, methods for heating the evaporation source generally include the resistance heating method (RH methods) and the electron beam heating method (EB method, electron beam deposition method), and also include methods using a laser beam, the high frequency induction heating method, and the like. Further, there have also been known flash deposition, arc plasma deposition, reactive deposition, and the like, which fall into the category of vacuum vapor deposition.

In the case where a film of an oxide such as the above-described ITO is deposited, the above-described electron beam deposition has been historically often utilized. Specifically, by using an oxide evaporation material (also referred to as ITO tablet or ITO pellet) of ITO as an evaporation source, introducing $O_2$ gas as a reactant gas into a deposition chamber (chamber), and accelerating thermoelectrons exiting from a filament (usually, a W wire) for generating thermoelectrons using an electric field to irradiate the oxide evaporation material of ITO with the thermoelectrons, the irradiated portion is locally heated to a high temperature to evaporate and be deposited on a substrate. Moreover, activated reactive evaporation (ARE) is also a useful method for ITO deposition. In the activated reactive evaporation, a plasma is produced using a thermoelectron emitter or a radio frequency discharge, an evaporant and a reactant gas ($O_2$ gas or the like) are activated by the plasma, and thus a low-resistance film can be formed on a substrate at a low temperature. Further, recently, high-density plasma-assist evaporation (HDPE) using a plasma gun has proved to be an effective approach for ITO deposition, and has started being industrially broadly used (see Non-Patent Document 1: "Vacuum," Vol. 44, No. 4, 2001, pp. 435-439). In this method, an arc discharge produced using a plasma generating device (plasma gun) is utilized. The arc discharge is maintained between a cathode incorporated in the plasma gun and a crucible (anode) for an evaporation source. Electrons emitted from the cathode are guided by a magnetic field and applied to part of an oxide evaporation material of ITO placed in the crucible in a focused manner. An evaporant evaporates from a portion locally heated to a high temperature by being irradiated with this electron beam, and is deposited on a substrate. Since the vaporized evaporant and the introduced $O_2$ gas are activated in this plasma, an ITO film having favorable electrical properties can be formed. Moreover, in another method of classifying these various vacuum vapor deposition methods, vacuum vapor deposition methods involving the ionization of an evaporant and a reactant gas are collectively called ion plating (IP method), and are effective as methods for obtaining an ITO film having a low resistance and a high transmittance (see Non-Patent Document 2: "Technology of transparent conductive film," Ohmsha, Ltd., 1999, pp. 205-211).

Further, in any type of solar cells to which the above-described transparent conductive film is applied, the above-described transparent conductive film is necessary for an electrode on a front side on which light is incident. Heretofore, the above-described ITO film, an aluminum-doped zinc oxide (AZO) film, or a gallium-doped zinc oxide (GZO) film has been utilized. Further, these transparent conductive films are required to have properties such as a low resistance and a high transmittance for visible light. Moreover, as methods for forming these transparent conductive films, vacuum vapor deposition methods such as the aforementioned ion plating and high-density plasma-assist evaporation are used.

The above-described ITO, AZO, and GZO films are materials having low resistances and high transmittances in the visible region, but have low transmittances in the near-infrared region. This is because these materials have high carrier concentrations, and hence near-infrared light is absorbed or reflected. However, in recent years, a high-efficiency solar cell has been being urgently developed in which the energy of near-infrared light is also effectively utilized by using a transparent conductive film having a high transmittance in the visible to near-infrared region and a high electrical conductivity as an electrode on a front side. Further, as such a transparent conductive film, a crystalline transparent conductive film (crystalline In—W—O) made of tungsten-containing indium oxide is disclosed in Patent Document 1 (Japanese Patent Application Publication No. 2004-43851). Moreover, the inventors of the present invention have revealed that a crystalline transparent conductive film made of cerium-containing indium oxide also has features similar to those of the above-described crystalline In—W—O film, and have found that the crystalline transparent conductive film made of cerium-containing indium oxide exerts more excellent transparency in the near-infrared region and electrical conductivity.

On the other hand, the above-described thin films containing indium oxide, tin oxide, or zinc oxide as a main component are also utilized as optical films. These thin films are high-refractive-index materials with refractive indices of 1.9 to 2.1 in the visible region, and enable the effect of interference of light to be exerted when the thin films are combined with low-refractive-index films with refractive indices of 1.3 to 1.5 in the visible region, such as silicon oxide films and metal fluoride films, to form stacked bodies. Specifically, by precisely controlling the thicknesses of films of a stacked body, antireflection effect or reflection enhancement effect in a specific wavelength region can be imparted to the stacked body. In the case of this application, a high-refractive-index film with a higher refractive index is more useful because a strong interference effect can be more easily obtained.

Further, Patent Document 2 (Japanese Patent Application Publication No. 2005-242264) shows that a cerium-containing indium oxide film has a higher refractive index than the above-described tin oxide films, zinc oxide films, and the like, and discloses an example in which the cerium-containing indium oxide film is utilized as an optical film. Furthermore, Patent Document 3 (Japanese Patent No. 3445891) and Patent Document 4 (Japanese Patent Application Publication No. 2005-290458) disclose techniques relating to a sputtering target material (In—Ce—O) of cerium-containing indium oxide and a transparent conductive film obtained by sputtering using this sputtering target material. Specifically, Patent Document 3 discloses that a transparent conductive film with high transparency and excellent heat resistance can be achieved by stacking a cerium-containing indium oxide-based transparent conductive film and a Ag-based ultra thin film on top of each other, because a cerium-containing indium oxide-based transparent conductive film has poor reactivity with Ag. Meanwhile, Patent Document 4 discloses that a film with excellent etchability can be obtained.

In the case where a thin film such as the above-described transparent conductive film or optical film is formed by a vacuum vapor deposition method such as electron beam deposition, ion plating, or high-density plasma-assist evaporation, a sintered body having a small size (e.g., a circular cylindrical shape having a diameter of approximately 10 to 50 mm and a height of approximately 10 to 50 mm) is used as an oxide evaporation material in this vacuum vapor deposition method. Thus, the quantity of films capable of being formed using one oxide evaporation material is limited. Further, when the consumption of the oxide evaporation material becomes large and the residual amount thereof becomes small, it is necessary to suspend deposition, introduce atmospheric air into a deposition chamber in a vacuum, replace the oxide evaporation material with an unused oxide evaporation material, and evacuate the deposition chamber to a vacuum again. This has been a factor in the deterioration of productivity.

Moreover, as a technique necessary for mass-producing thin films such as transparent conductive films or optical films by a vacuum vapor deposition method such as electron beam deposition, ion plating, or high-density plasma-assist evaporation, there are methods in which the above-described oxide evaporation materials are continuously fed. One example of the methods is described in Non-Patent Document 1. In this continuous feed method, circular cylindrical oxide evaporation materials are housed in a row in a cylindrical hearth, and the oxide evaporation materials are sequentially pushed out to be continuously fed with a sublimation surface maintained at a constant height. Further, the oxide evaporation material continuous feed method enables the mass production of thin films such as transparent conductive films and optical films by vacuum vapor deposition.

Cerium-containing indium oxide films are generally formed by sputtering as disclosed in Patent Documents 3 and 4. However, in recent years, there has been a strong demand for formation by various vacuum vapor deposition methods which are advantageous in terms of productivity.

However, there have been few techniques relating to oxide evaporation materials for stably forming cerium-containing indium oxide films by vacuum vapor deposition. Accordingly, techniques for making sintered bodies as sputtering targets have been adopted so far to manufacture the oxide evaporation materials.

It should be noted, however, that in a method in which a technique relating to a sputtering target is adopted, a sintered body after firing has a surface chemical composition different from the chemical composition of the interior thereof, and is therefore shaped into a tablet (oxide evaporation material) having a predetermined shape by removing the surface thereof by grinding. This makes it possible to obtain a tablet having a uniform chemical composition from the surface thereof to the interior thereof, but there have been problems such as high manufacturing cost. Moreover, in the method using the adopted technique, the density of the sintered body obtained is high, and shrinkage during sintering is large. Thus, there has also been the problem that desired dimensions are difficult to obtain after sintering. Accordingly, due to the problems of the deviation of the surface chemical composition of the sintered body and shrinkage during sintering, a slightly large sintered body is prepared in advance, and the surface thereof is removed by grinding, thus obtaining a sintered body without chemical composition deviation having desired dimensions. However, since the density of the sintered body obtained is high in the first place, there have been problems such as the cracking of the tablet due to thermal stress during vapor deposition.

On the other hand, a predetermined shape can be obtained without performing the above-described grinding or the like after firing by carrying out a sintering method in which consideration is given to the percentage of shrinkage during sintering in advance. For example, employment of a method for making an ITO tablet enables a tablet (oxide evaporation material) having desired dimensions to be obtained without performing grinding after firing. However, a cerium-containing indium oxide sintered body made by such a method also has different chemical compositions between the surface and interior thereof. A reason for this is as follows: since a cerium-containing indium oxide sintered body include a mixture of two separate phases, i.e., a crystalline phase of a solid solution of cerium in indium oxide and a crystalline phase of cerium oxide, the indium oxide phase having a high vapor pressure more easily evaporates at the surface of the sintered body at a high temperature during the production of the sintered body. On the other hand, the aforementioned sintered body of ITO includes a crystalline phase of a solid solution of tin in indium oxide and a crystalline phase of tin indate compound with no tin oxide phase remaining, and is therefore less prone to the above-described problem. Further, when deposition is performed using an oxide evaporation material obtained from a sintered body having different chemical compositions between the surface thereof and the interior thereof, the chemical compositions of thin films greatly fluctuate in early stages of the deposition. Thus, film portions formed in the early stages cannot be used. Accordingly, there have been problems such as a low production amount of thin films per tablet.

The present invention has been made by focusing attention on such problems. An object of the present invention is to provide an oxide tablet for vapor deposition (oxide evaporation material) containing indium oxide as a main component and cerium and having a uniform chemical composition from the surface thereof to the interior thereof.

DISCLOSURE OF THE INVENTION

In this respect, the inventors have continued diligent researches in order to solve the above-described problems, and then have come to find out that an oxide tablet for vapor deposition (oxide evaporation material) containing indium oxide as a main component and cerium and having a uniform chemical composition from the surface thereof to the interior thereof can be obtained by employing, in producing a cerium-containing indium oxide sintered body, an approach in which an indium oxide component is prevented from evaporating from a surface of the sintered body during high-temperature firing. The present invention has been completed based on such a technical finding.

Specifically, an oxide evaporation material according to the present invention comprises a sintered body which contains indium oxide as a main component and cerium and which is subjected to no surface grinding after sintering, in which $Comp^S/Comp^A=0.9$ to $1.1$, where the content of cerium in a surface layer to a depth of 5 μm from a surface of the sintered body is represented by a Ce/In atomic ratio ($Comp^S$), and an average value of the content of cerium in the entire sintered body is represented by a Ce/In atomic ratio ($Comp^A$).

Moreover, a vapor-deposited thin film according to the present invention containing indium oxide as a main component and cerium is formed by any one of electron beam deposition, ion plating, and high-density plasma-assist evaporation, using the above-described oxide evaporation material as a raw material, and an average value of the content of cerium in the thin film formed is 0.001 to 0.538 in terms of Ce/In atomic ratio.

A solar cell according to the present invention comprises an electrode formed of the above-described vapor-deposited thin film.

Here, since the oxide evaporation material according to the present invention comprises a sintered body which contains indium oxide as a main component and cerium and which is subjected to no surface grinding after sintering, in which $Comp^S/Comp^A=0.9$ to $1.1$, where the content of cerium in a surface layer to a depth of 5 μm from a surface of the sintered body is represented by a Ce/In atomic ratio ($Comp^S$), and an average value of the content of cerium in the entire sintered body is represented by a Ce/In atomic ratio ($Comp^A$), the surface chemical composition of the sintered body is approximately the same as the chemical composition of the interior thereof. Thus, the sintered body can be used as it is as an evaporation material without performing grinding after firing.

Accordingly, manufacturing cost can be greatly reduced to enable an inexpensive oxide tablet for vapor deposition (oxide evaporation material) to be provided. Also, since the tablet has an approximately uniform chemical composition from the surface of the tablet to the interior thereof, the tablet can be used for the formation of thin films even in early stages of use of the tablet. Thus, the effect of increasing the production amount of thin films per tablet is obtained.

Moreover, the vapor-deposited thin film comprising an electrically-conductive transparent crystalline film which is formed using the oxide evaporation material of the present invention, in which the average value of the content of cerium in the thin film is 0.004 to 0.056 in terms of Ce/In atomic ratio, and which has a specific resistance of not more than $3.5 \times 10^{-4}$ Ωcm has a high transmittance in the visible to near-infrared region and a high electrical conductivity, and therefore has the effect that the vapor-deposited thin film can be applied as a front-side electrode of a solar cell.

Furthermore, a vapor-deposited thin film comprising a high-refractive-index transparent film which is formed using the oxide evaporation material of the present invention, in which the average value of the content of cerium in the thin film is 0.090 to 0.538 in terms of Ce/In atomic ratio, and which has a refractive index of not less than 2.15 at a wavelength of 550 nm also has the effect that the vapor-deposited thin film can be applied to optical film use such as an antireflection film when the vapor-deposited thin film is combined with a low-refractive-index film to form a stacked body.

BEST MODES FOR PRACTICING THE INVENTION

Figure 1:
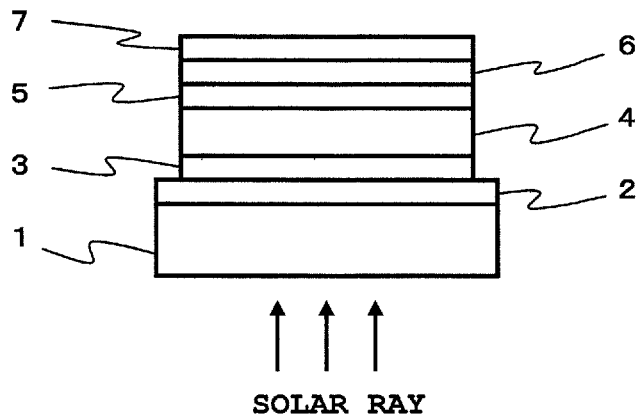
FIG. 1 is an explanatory diagram showing a schematic configuration of a silicon-based solar cell in which a transparent conductive film according to the present invention is used as an electrode layer.

Hereinafter, embodiments of the present invention will be described in detail.

(1) Oxide Evaporation Material (Oxide Tablet for Vapor Deposition)

An oxide evaporation material (oxide tablet for vapor deposition) of the present invention comprises a sintered body which contains indium oxide as a main component and cerium and which is subjected to no surface grinding after sintering, in which $Comp^S/Comp^A=0.9$ to $1.1$, where the content of cerium in a surface layer to a depth of 5 μm from a surface of the sintered body is represented by a Ce/In atomic ratio ($Comp^S$), and an average value of the content of cerium in the entire sintered body is represented by a Ce/In atomic ratio ($Comp^A$). Further, a greatest feature is that the oxide evaporation material is produced without grinding the surface of the sintered body after firing.

An example of a methods for measuring the Ce/In atomic ratio ($Comp^S$) in the surface layer of the sintered body is a method in which the sintered body is fractured to expose a fracture surface thereof, and the Ce/In atomic ratio ($Comp^S$) is measured by performing chemical composition analysis on this fracture surface in a region at distances of not more than 5 μm from the surface of the sintered body with an EPMA (Electron Probe Micro Analyzer). Specifically, the chemical composition of the surface layer of the sintered body can be determined by performing spot analysis on the fracture surface in the region at distances of not more than 5 μm from the surface of the sintered body (portion at distances of not more than 5 μm from the periphery of the cross section of the fracture surface) with an EPMA and averaging analytical values for 20 to 30 points.

The above-described average value [Ce/In atomic ratio ($Comp^A$)] of the content of cerium in the entire sintered body can be determined by pulverizing the sintered body, agitating the powder obtained, and measuring the Ce/In atomic ratio by EPMA analysis as described above.

It should be noted that an oxide evaporation material in which $Comp^S/Comp^A$=0.9 to 1.1 can be made without grinding the surface of the sintered body after firing by employing an undermentioned approach in which, in producing a cerium-containing indium oxide sintered body, the "indium oxide" component is prevented from evaporating from the surface of the sintered body during high-temperature firing. Specifically, the oxide evaporation material (oxide tablet for vapor deposition) according to the present invention can be produced as follows: powders of indium oxide and cerium oxide are used as raw materials; these raw materials are mixed and formed into a green compact, and are reacted with each other and sintered by employing the undermentioned approach in which the "indium oxide" component does not evaporate from the surface of the sintered body when the green compact is fired at a high temperature. It should be noted that powders of indium oxide and cerium oxide do not need to be special ones but may be raw materials for oxide sintered bodies used heretofore. Further, average particle diameters of powders to be used are not more than 1.5 μm, and preferably 0.1 to 1.1 μm.

First, as a general method for mixing raw material powders in producing the above-described oxide sintered body, a mixing method using a ball mill is utilized. This mixing method is also effective for producing the sintered body of the present invention. A ball mill is an apparatus which grinds and mixes materials to produce a fine powder mixture by putting hard balls (ball diameter: 10 to 30 mm) of ceramic or the like and raw material powders into a container and rotating the container. In the ball mill (grinding media), a drum thereof is made of steel, stainless, nylon, or the like, and a liner is made of alumina, porcelain, natural silica stone, rubber, urethane, or the like. The balls are alumina balls mainly made of alumina, natural silica stones, nylon balls with iron cores, zirconia balls, or the like. There are wet and dry grinding methods, which are widely utilized for mixing and grinding raw material powders for obtaining a sintered body.

Further, other than a mixing method using a ball mill, methods using a bead mill or a jet mill are also effective. In particular, since cerium oxide powder is a hard material, these methods are very effective in the case where a raw material with a large average particle diameter is used or where grinding and mixing need to be performed in a short period of time. In the bead mill method, a container called a vessel is 70 to 90% filled with beads (grinding media, bead diameter: 0.005 to 3 mm), and a rotating shaft at the center of the vessel is rotated at a peripheral speed of 7 to 15 m/sec to impart motion to the beads. To this vessel, a slurry obtained by mixing materials to be ground such as raw material powders with a liquid is fed using a pump. The beads collide with the slurry for pulverization and dispersion. In the case of the bead mill, efficiency can be increased by reducing the diameter of the beads depending on the materials to be ground. In general, bead mills can achieve fine grinding and mixing with accelerations almost 1,000 times those of ball mills. Bead mills having such a mechanism are called by various names, and, for example, sand grinder, aquamizer, attritor, pearl mill, Apex Mill, Ultra Visco Mill, Dyno Mill, agitator mill, co-ball mill, spike mill, SC mill, and the like are known. Any of these mills can be used in the present invention. On the other hand, the jet mill method is a method in which high-pressure air or steam jetted from a nozzle at a speed approximately equal to the speed of sound is collided against materials to be ground such as raw material powders as an ultra high speed jet to grind the materials into fine particles by impact between particles.

As described previously, an indium oxide powder and a cerium oxide powder are put at a desired ratio into a pot for a ball mill and dry- or wet-mixed. Thus, a powder mixture is prepared first. With regard to the compounding ratio of the above-described raw material powders, the contents of indium and cerium are preferably set so that the Ce/In atomic ratio may be 0.001 to 0.538 in order to obtain the oxide sintered body of the present invention.

Water and organic materials such as a dispersing agent and a binder are added to the powder mixture prepared as described above to make a slurry. The viscosity of the slurry is preferably 150 to 5000 cP, and more preferably 400 to 3000 cP.

Next, the slurry obtained and beads are put into a container of a bead mill, and processing is performed. The material of the beads may be zirconia, alumina, or the like, and zirconia is preferable in terms of resistance to wear. The diameters of the beads are preferably 1 to 3 mm in terms of the efficiency of grinding. The number of times of passing may be one, but two or more is preferable. Five is enough to obtain sufficient effect. Further, processing time is preferably not more than 10 hours, and more preferably 4 to 8 hours.

The above-described processing enables the indium oxide powder and the cerium oxide powder in the slurry to be favorably ground and mixed.

Next, the slurry thus processed is molded. As a molding method, any of cast molding and press molding may be employed. In the case of cast molding, the slurry obtained is poured into a mold for cast molding to form a molded body. The time between the processing using the bead mill and the cast molding is preferably not more than 10 hours, because this can prevent the slurry obtained from exhibiting thixotropy. On the other hand, in the case of press molding, a binder, such as polyvinyl alcohol, and the like are added to the slurry obtained, moisture control is performed as needed, and then drying is performed using a spray dryer or the like. Thus, granulation is performed. The granulated powder obtained is filled into a mold having a predetermined size, and then uniaxial press molding is performed under a pressure of 100 to 1000 kg/cm$^2$ using a pressing machine to obtain a molded body. In consideration of shrinkage in a subsequent firing step, the thickness of the molded body at this time is preferably set to such a thickness that a sintered body having a predetermined size can be obtained.

By using the molded body made from the above-described powder mixture, the oxide sintered body of the present invention can be obtained by any of hot press and atmospheric pressure sintering. However, manufacturing by atmospheric pressure sintering is more preferable because of low manufacturing cost. To obtain the oxide sintered body of the invention by using atmospheric pressure sintering and employing the approach in which the "indium oxide" component does not evaporate from the surface of the sintered body, the following steps are performed.

First, debinding is performed on the obtained molded body by heating the molded body at a temperature of 300 to 500° C. for approximately 5 to 20 hours. Then, the temperature is raised to perform sintering. The rate of temperature rise is not more than 150° C./hour so that inside bubbles causing gas defects may be effectively released outside. The rate of temperature rise is preferably not more than 100° C./hour, and more preferably not more than 80° C./hour. The sintering temperature is 1150 to 1350° C., and preferably 1200 to 1250° C. The sintering time is 1 to 20 hours, and preferably 2 to 5 hours.

In the above-described steps from debinding to sintering, it is important to introduce oxygen into a furnace at a rate of not less than 5 liters/min for every 0.1 m$^3$ of the furnace volume. A purpose of introducing oxygen during the above-described sintering step is to obtain a sintered body having a uniform chemical composition from the surface thereof to the interior thereof by preventing surface components from evaporating from the surface of the sintered body during the sintering step. Specifically, this is because oxygen tends to dissociate from the sintered body at 1150° C. or higher, and, in an over-reduced state, surface components (in particular, indium oxide) of the oxide sintered body readily evaporate. Further, a reason for setting the upper limit of the sintering temperature to 1350° C. is as follows: when firing is performed at a high temperature exceeding 1350° C., oxygen rapidly dissociates from the sintered body even if the above-described oxygen introduction is performed in the sintering step; this results in an over-reduced state to cause surface components of the oxide sintered body to evaporate. Furthermore, to obtain a sintered body having a uniform chemical composition from the surface thereof to the interior thereof, it is preferable to place near the sintered body a powder (hereinafter referred to as "atmosphere adjustment powder") or green compact (hereinafter referred to as "atmosphere adjustment green compact") of cerium-containing indium oxide having the same chemical composition as that of the oxide sintered body to be obtained. By placing the above-described atmosphere adjustment powder (or atmosphere adjustment green compact) near the sintered body, the sintering furnace is filled with metal oxide components evaporating from the atmosphere adjustment powder (or atmosphere adjustment green compact), and therefore the evaporation of metal oxides from the surface of the sintered body can be reduced as much as possible. This makes it possible to produce a sintered body having a uniform chemical composition from the surface thereof to the interior thereof. It should be noted that the atmosphere adjustment powder or atmosphere adjustment green compact is preferably powder of cerium-containing indium oxide having the same chemical composition as that of the oxide sintered body to be obtained. As described above, it is important to perform the sintering step while introducing oxygen under the condition that the sintering temperature is 1150 to 1350° C., with the above-described atmosphere adjustment powder or atmosphere adjustment green compact placed near the sintered body. Further, in the case where these conditions are satisfied, a cerium-containing indium oxide sintered body having a uniform chemical composition from the surface of the sintered body to the interior thereof can be obtained without performing surface grinding after sintering.

Then, after the sintering, the temperature is reduced to room temperature under a condition of 10° C./min, and the sintered body can be taken out of the furnace at room temperature. It is also effective to perform heat treatment, i.e., optimum reduction treatment, in an atmosphere containing an appropriate amount of oxygen at temperatures from 950 to 1100° C. during the temperature reduction.

The sintered body thus obtained has a uniform chemical composition from the surface of the sintered body to the interior thereof, and therefore can be used as it is as an oxide evaporation material (oxide tablet for vapor deposition) without performing grinding or the like after sintering. At this time, an oxide evaporation material (oxide tablet for vapor deposition) having optimum dimensions can be obtained after sintering, by using a molded body having a size previously adjusted in consideration of the percentage of shrinkage due to sintering so that predetermined dimensions may be obtained after sintering.

It should be noted that the oxide evaporation material (oxide tablet for vapor deposition) according to the present invention is preferably such that the average value, Ce/In atomic ratio (Comp$^4$), of the content of cerium in the entire sintered body is 0.001 to 0.538. In the case where the above-described average value is less than 0.001, the effects of increasing carrier concentration and mobility are small in a thin film formed using this oxide evaporation material (oxide tablet for vapor deposition), and therefore a low-resistance vapor-deposited thin film cannot be obtained in some cases. On the other hand, the above-described average value of more than 0.538 is not preferred for the following reasons: the amount of cerium in the oxide evaporation material (oxide tablet for vapor deposition) is too large to obtain a sintered body having a practical strength; also, electrical conductivity needed for the tablet itself becomes difficult to obtain, and stable use of the tablet in electron beam deposition may become difficult. Specifically, an excessive amount of cerium increases neutral impurity scattering in electron transport to decrease mobility, and therefore a low-resistance vapor-deposited thin film cannot be obtained. Further, a more preferable content of cerium for obtaining a low-resistance vapor-deposited thin film exerting high mobility is 0.004 to 0.056 in terms of Ce/In atomic ratio.

Moreover, the oxide evaporation material (oxide tablet for vapor deposition) according to the present invention preferably has a circular cylindrical shape. Such a shape is suitable for continuously feeding tablets because stable sublimation of a circular upper surface is facilitated. Specifically, when one tablet is finished being consumed and deposition is subsequently performed using another tablet, the use of the oxide evaporation material (oxide tablet for vapor deposition) of the present invention has advantages such as constant properties of thin films because the chemical composition of the surface layer thereof is the same as that of the interior thereof.

Further, the oxide evaporation material (oxide tablet for vapor deposition) according to the present invention may contain elements other than indium, cerium, and oxygen, e.g., tin, tungsten, molybdenum, zinc, cadmium, niobium, and the like, as long as characteristics of the present invention are not impaired. It should be noted, however, that the oxide evaporation material according to the present invention preferably contains no metal ions which form oxides having much higher vapor pressures than indium oxide and cerium oxide because of the difficulty of evaporation by vacuum vapor deposition methods. For example, metals such as aluminum, titanium, silicon, germanium, and zirconium are not easily evaporated with indium oxide and cerium oxide when contained in the oxide evaporation material, because oxides of these metals have much higher vapor pressures than indium oxide and cerium oxide. For this reason, such metals remain in the oxide evaporation material, and are concentrated, and finally interfere with the evaporation of indium oxide and cerium oxide. Thus, such metals should not be contained because of adverse influences thereof such as described above.

(2) Vapor-Deposited Thin Film

Next, a vapor-deposited thin film according to the present invention comprises a thin film which contains indium oxide as a main component and cerium and which is formed by any one of electron beam deposition, ion plating, and high-density plasma-assist evaporation using the above-described oxide evaporation material of the present invention as a raw material.

Further, the vapor-deposited thin film preferably comprises a crystalline film in which the average value of the content of cerium in the thin film formed is 0.004 to 0.056 in terms of Ce/In atomic ratio. By forming the vapor-deposited thin film as a crystalline film, high mobility can be exerted when cerium replaces indium sites of indium oxide to form a solid solution. The crystalline film can be obtained by heating a substrate in the deposition process to a temperature of not less than 180° C., or also by a method in which a thin film formed by a non-thermal process is annealed at a temperature of not less than 180° C. Setting the Ce/In atomic ratio in a range from 0.004 to 0.056 makes it possible to obtain a transparent conductive film having a Hall mobility of not less than 80 $cm^2/V \cdot s$, a carrier concentration of not more than $3.3 \times 10^{20}$ $cm^{-3}$, and a specific resistance of not more than $3.5 \times 10^{-4}$ $\Omega cm$. Moreover, since the vapor-deposited thin film (transparent conductive film) according to the present invention has a low carrier concentration, the thin film has an extremely high average transmittance of 80% or more at wavelength of 800 to 1200 nm.

Furthermore, the vapor-deposited thin film may comprise a high-refractive-index transparent film in which the average value of the content of cerium in the thin film formed is 0.090 to 0.538 in terms of Ce/In atomic ratio and which has a refractive index of not less than 2.15 at a wavelength of 550 nm. Setting the Ce/In atomic ratio to a value of not less than 0.090 can increase the refractive index in the visible region. Further, by increasing the refractive index of the above-described transparent film to not less than 2.15, the transparent film enables the effect of interference of light to be exerted when combined with a low-refractive-index film with a refractive index of 1.3 to 1.5 in the visible region, such as a silicon oxide film or a metal fluoride film, to form a stacked body. Specifically, by precisely controlling the thicknesses of films of a stacked body, antireflection effect or reflection enhancement effect in a specific wavelength region can be imparted to the stacked body. In this case, the above-described vapor-deposited thin film may be a crystalline film, an amorphous film, or a film having both crystalline and amorphous regions.

Further, similar to the aforementioned oxide evaporation material (oxide tablet for vapor deposition), the vapor-deposited thin film of the present invention may contain elements other than indium, cerium, and oxygen, e.g., tin, tungsten, molybdenum, zinc, cadmium, and the like, as long as characteristics of the present invention are not impaired.

(3) Solar Cell

A solar cell according to the present invention is a photoelectric conversion device comprising an electrode formed of the above-described vapor-deposited thin film (hereinafter referred to as a transparent conductive film in some cases as described previously). The structure of a solar cell device is not particularly limited, and examples thereof include a PN junction type in which a p-type semiconductor and an n-type semiconductor are stacked on top of each other, a PIN junction type in which an insulating layer (I layer) is interposed between a p-type semiconductor and an n-type semiconductor, and the like.

Further, solar cells are broadly classified into the following types according to semiconductor types: solar cells using silicon-based semiconductors such as single crystal silicon, polycrystalline silicon, and amorphous silicon; compound thin film solar cells using thin films of compound semiconductors represented by CuInSe-based, Cu(In,Ga)Se-based, Ag(In,Ga)Se-based, CuInS-based, Cu(In,Ga)S-based, Ag(In, Ga)S-based, solid solutions of the foregoing, GaAs-based, CdTe-based, and the like; and dye-sensitized solar cells (also called Grätzel cell-type solar cells) using organic dyes. The solar cell according to the present invention may be of any type, and high efficiency can be achieved by using the aforementioned transparent conductive film as an electrode. In particular, in amorphous silicon solar cells and compound thin film solar cells, a transparent conductive film is necessary for an electrode on a sunlight incident side (light-receiving side, front side), and high conversion efficiency properties can be exerted by using the vapor-deposited thin film (transparent conductive film) of the present invention.

The above-described silicon-based solar cell will be outlined. In a PN junction-type solar cell element, a single-crystal or polycrystalline silicon substrate is used which has, for example, a thickness of approximately 0.2 to 0.5 mm and a size of approximately 180 mm square. In the silicon substrate of the element, a PN junction is formed in which a P layer containing a large amount of a p-type impurity such as boron and an N layer containing a large amount of an n-type impurity such as phosphorus are in contact with each other.

Further, a transparent substrate such as a glass plate, a resin plate, or a resin film may also be used instead of the above-described silicon substrate. In the present invention, a transparent substrate is preferable. In this case, the transparent conductive film of the present invention is formed on the substrate as an electrode, and then amorphous or polycrystalline silicon is stacked on top of the transparent conductive film. Such a solar cell is broadly classified into thin film silicon-based solar cells.

In the case of amorphous silicon, a PIN junction is formed in which an insulating layer (I layer) is inserted in a PN junction. Specifically, as shown in FIG. 1, a structure is employed in which, on a glass substrate 1, a front-side (light-receiving side) transparent electrode film 2, a p-type amorphous silicon film or a hydrogenated amorphous silicon carbide film 3, an undoped amorphous silicon film 4, an n-type amorphous silicon film 5, a back-side transparent electrode film (contact improvement layer) 6, and a back-side metal electrode, i.e., a back electrode 7, are stacked on top of each other. It should be noted that the p-type amorphous silicon film or hydrogenated amorphous silicon carbide film 3, the undoped amorphous silicon film 4, and the n-type amorphous silicon film 5 are generally formed by plasma CVD. These amorphous silicon and hydrogenated amorphous silicon films may contain germanium, carbon, nitrogen, tin, or the like in order to control optical absorption wavelengths.

It should be noted that thin film solar cells using silicon thin films are classified into the following types: solar cells in which a photoelectric conversion layer including silicon thin films comprises amorphous silicon thin films; solar cells in which a photoelectric conversion layer including silicon thin films includes microcrystalline silicon thin films; and solar cells in which a photoelectric conversion layer including silicon thin films includes amorphous and microcrystalline silicon thin films (tandem thin film photoelectric conversion layer). The solar cell according to the present invention may have any of these structures as long as the transparent conductive film of the present invention is used as an electrode. Also, the solar cell according to the present invention may be a solar cell having a hybrid photoelectric conversion layer in which a photoelectric conversion layer made of a single-crystal or polycrystalline silicon plate and the above-described thin film photoelectric conversion layer are stacked on top of each other as long as the transparent conductive film of the present invention is used as an electrode.

Next, the aforementioned compound thin film solar cell will be described. A solar cell using compound thin films generally comprises a hetero junction of a compound semiconductor thin film (intermediate layer of an n-type semiconductor) having a wide band gap and a compound semiconductor (optical absorption layer of a p-type semiconductor) having a narrow band gap. A general structure is as follows: front surface electrode (transparent conductive film)/window layer/intermediate layer/optical absorption layer/back electrode (metal or transparent conductive film).

Figure 2:
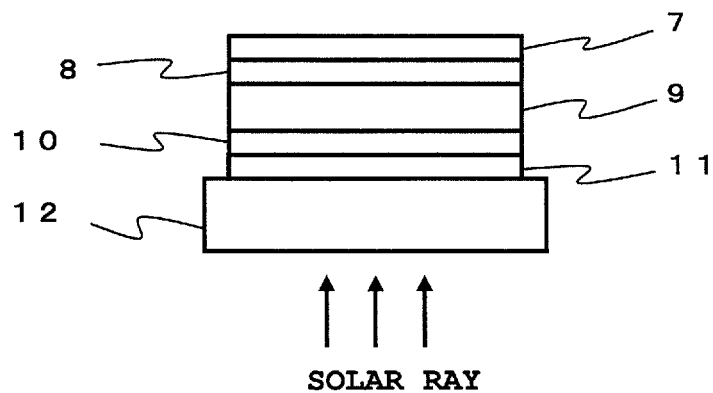
FIG. 2 is an explanatory diagram showing a schematic configuration of a compound thin film solar cell in which an electrode layer made of a transparent conductive film according to the present invention is used on a glass substrate side.
Figure 3:
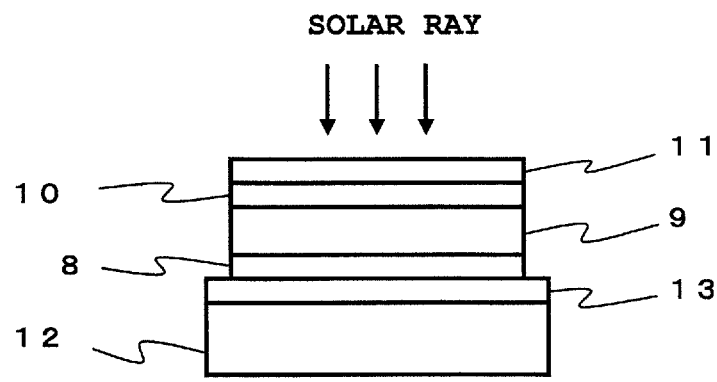
FIG. 3 is an explanatory diagram showing a schematic configuration of a compound thin film solar cell in which an electrode layer made of a transparent conductive film according to the present invention is used on an opposite side from a glass substrate.

Specifically, as shown in FIG. 2, on a glass substrate 12, a transparent electrode film 11 made of the transparent conductive film of the present invention, a window layer 10 made of a ZnO thin film, an intermediate layer 9 of a semiconductor, an optical absorption layer 8 of a p-type semiconductor, and a back electrode 7 made of a Au film are stacked on top of each other. Moreover, in FIG. 3, on a glass substrate 12, a lower electrode, i.e., a back electrode 13, an optical absorption layer 8 of a p-type semiconductor, an intermediate layer 9 of a semiconductor, a window layer 10, and a transparent electrode film 11 made of the transparent conductive film of the present invention are stacked on top of each other. In either structure, the transparent electrode film 11 side is the direction of incidence of sunlight.

It should be noted that the substrate is not particularly limited in terms of the material thereof such as glass described above, resin, metal, or ceramic, and may be transparent or non-transparent. However, a transparent substrate is preferable. In the case of resin, substrates having various shapes such as a plate-shaped one and a film-shaped one can be used, and a substrate having a low melting point of, for example, not higher than 150° C. may be used. In the case of metal, substrates of stainless steel, aluminum, and the like can be used. In the case of ceramic, substrates of alumina, zinc oxide, carbon, silicon nitride, silicon carbide, and the like can be used. A substrate containing an oxide selected from Ga, Y, In, La, Si, Ti, Ge, Zr, Sn, Nb, and Ta as an oxide other than alumina and zinc oxide can also be used. Such oxides include, for example, $Ga_2O_3$, $Y_2O_3$, $In_2O_3$, $La_2O_3$, $SiO_2$, $TiO_2$, $GeO_2$, $ZrO_2$, $SnO_2$, $Nb_2O_5$, $Ta_2O_5$, and the like. In the present invention, the above-described glass, resin, and ceramic substrates are referred to as nonmetal substrates. It is desirable to roughen at least one surface of the substrate by the provision of a pyramidal texture, etching, or the like to increase the reflection of incident solar rays.

Further, a conductive electrode material such as Mo, Ag, Au, Al, Ti, Pd, Ni, or an alloy thereof is used for the above-described back electrode 13, and any one of Mo, Ag, Au, and Al is preferable. The thickness of the back electrode 13 is generally 0.5 to 5 µm, and preferably 1 to 3 µm. Formation means therefor is not particularly limited. For example, direct current magnetron sputtering, vacuum vapor deposition, CVD, and the like can be utilized.

Moreover, as the p-type semiconductor constituting the above-described optical absorption layer 8, $CuInSe_2$, $CuInS_2$, $CuGaSe_2$, $CuGaS_2$, $AgInSe_2$, $AgInS_2$, $AgGaSe_2$, $AgGaS_2$, a solid solution thereof, or CdTe can be used. Conditions required to obtain higher energy conversion efficiency are optimum optical design for obtaining a larger photocurrent and the formation of high-quality hetero junction and thin film in which carriers do not recombine at an interface or particularly in the absorption layer. The thickness of the optical absorption layer 8 is generally 1 to 5 µm, and preferably 2 to 3 µm. Formation means therefor is not particularly limited. For example, vacuum vapor deposition, CVD, and the like can be utilized. Further, a high-quality hetero junction has a strong relationship with the intermediate layer/absorption layer combination. A useful hetero junction can be obtained using CdS/CdTe-based, $CdS/CuInSe_2$-based, $CdS/Cu(In,Ga)Se_2$-based, $CdS/Ag(In,Ga)Se_2$-based, or the like.

Further, to increase the efficiency of the solar cell, a semiconductor having a wider band gap, e.g., CdS, CdZnS, or the like, is used as a semiconductor thin film constituting the intermediate layer 9. Using these semiconductor thin films, sensitivity to sunlight at short wavelengths can be enhanced. The thickness of the intermediate layer 9 is generally 10 to 200 nm, and preferably 30 to 100 nm. Formation means for the above-described intermediate layer 9 is not particularly limited. In the case of a CdS thin film, the intermediate layer 9 is formed by solution deposition using a mixed solution of $CdI_2$, $NH_4Cl_2$, $NH_3$, and thiourea. Further, on the incident light side of the intermediate layer 9 of CdS or (Cd,Zn)S, a semiconductor having a wider band gap than the thin film of CdS or (Cd,Zn)S can be placed as the window layer 10. This enables a high-performance solar cell with high reproducibility to be obtained. The above-described window layer 10 is made of a thin film having a conductivity comparable to that of a CdS thin film, e.g., a ZnO thin film, a (Zn,Mg)O thin film, or the like. The thickness of the window layer 10 is generally 50 to 300 nm, and preferably 100 to 200 nm. Moreover, formation means for the window layer 10 is not particularly limited. The window layer 10 is formed by a process such as direct current magnetron sputtering using a target of ZnO or the like and Ar as sputtering gas.

The solar cell according to the present invention is a compound thin film solar cell in which the transparent conductive film of the present invention is used as an electrode on the sunlight incident side (front surface and/or back surface) thereof. Since the transparent conductive film of the present invention has a lower resistance and a higher transmittance than conventional transparent conductive films, high conversion efficiency can be achieved.

In any of the above-described types of solar cell elements, bus bar electrodes and finger electrodes are formed on each of the light receiving side (front side) and back side thereof by a process such as screen printing using silver paste, and almost the whole surfaces of the electrodes are coated with solder in order to protect the electrodes and facilitate attachment of connection tabs to the electrodes. It should be noted that, in the case where the solar cell element is a silicon substrate, a transparent protection member such as a glass plate, a resin plate, or a resin film is provided on the light receiving side.

Moreover, the thickness of the transparent conductive film according to the present invention constituting the above-described electrode is not particularly limited, and is desirably 150 to 1500 nm, particularly 200 to 900 nm, depending on the chemical composition and the like of the material thereof. Further, the transparent conductive film of the present invention has a low resistance, and has a high transmittance for sunlight including visible to near-infrared rays at wavelengths of 380 nm to 1200 nm. Thus, the light energy of sunlight can be very effectively converted to electrical energy.

It should be noted that the vapor-deposited thin film (transparent conductive film) according to the present invention is also useful for transparent electrodes of light sensing elements, touch panels, flat panel displays (LCDs, PDPs, ELs, and the like), and light emitting devices (LEDs, LDs, and the like) other than solar cells. For example, a light sensing element includes a structure in which a glass electrode, a transparent electrode on the light incident side, a layer of a material for sensing light such as infrared rays, and a back electrode are stacked on top of each other. The light sensing material layer for sensing infrared rays is of a type [photodiode (PD) or avalanche photodiode (APD)] in which a Ge- or InGeAs-based semiconductor material is used, or a type in which a material such as one obtained by adding one or more elements selected from Eu, Ce, Mn, and Cu and one or more elements selected from Sm, Bi, and Pb to a sulfide or selenide of an alkaline-earth metal element is used. In addition, an APD using a stack of amorphous silicon-germanium and amorphous silicon has also been known. The vapor-deposited thin film (transparent conductive film) according to the present invention can be used for any of these.

Hereinafter, examples of the present invention will be specifically described.

Example 1

Preparation of Oxide Evaporation Material

An $In_2O_3$ powder having an average particle diameter of 0.8 μm and a $CeO_2$ powder having an average particle diameter of 1 μm were used as raw material powders. The $In_2O_3$ and $CeO_2$ powders were blended in such a manner that the Ce/In atomic ratio was 0.008. The blend was put into a resin pot, and mixed by a wet ball mill. Here, hard $ZrO_2$ balls were used, and the mixing time was 20 hours.

After the mixing, a slurry was taken out, and a binder of polyvinyl alcohol was added to the slurry obtained. The mixture was dried using a spray dryer or the like to be granulated.

The granulated product was subjected to uniaxial press molding at a pressure of 1 ton/cm² to prepare multiple circular cylindrical molded bodies having a diameter of 30 mm and a thickness of 40 mm.

Next, the multiple molded bodies obtained were sintered as follows.

First, the bottom of a sintering furnace was covered with a powder mixture (atmosphere adjustment powder) obtained by mixing $In_2O_3$ and $CeO_2$ powders in such a manner that the Ce/In atomic ratio was 0.008, and the molded bodies were placed on the atmosphere adjustment powder.

Further, the molded bodies were heated at a temperature of 300° C. in the atmosphere of the sintering furnace for approximately 10 hours to perform debinding, and then the temperature was raised at a rate of 1° C./min in an atmosphere in which oxygen was being introduced into the furnace at a rate of 5 liters/min for every 0.1 m³ of the furnace volume. At 1250° C., sintering was performed for 2 hours (atmospheric pressure sintering).

It should be noted that all sintering conditions are shown in Table 1a. Moreover, during cooling after sintering, also, the temperature was reduced to 1000° C. at 10° C./min while oxygen was being introduced.

A sintered body for analysis was selected from the sintered bodies obtained. The sintered body for analysis was fractured to expose a fracture surface thereof, and chemical composition analysis was performed on the fracture surface in a region at distances of not more than 5 μm from the surface of the sintered body with an EPMA (Electron Probe Micro Analyzer) to obtain the content of cerium [Ce/In atomic ratio ($Comp^S$)] in a surface layer to a depth of 5 μm from the surface of the sintered body. Specifically, EPMA spot analysis was performed at 30 points across the cross section of the sintered body in a region at distances of not more than 5 μm from the surface, and the average value thereof was regarded as the Ce/In atomic ratio ($Comp^S$) in the surface layer at distances of not more than 5 μm. With regard to EPMA measurement conditions, the acceleration voltage was 30 kV.

Next, the above-described sintered body for analysis was pulverized, and the powder obtained was agitated. In the same manner as described above, chemical composition analysis was performed with an EPMA. The Ce/In atomic ratio was measured at 30 points, and an average value thereof was calculated. The average value was regarded as the average Ce/In atomic ratio ($Comp^A$) of the entire sintered body. Further, the value $Comp^S/Comp^A$ was calculated which indicates the degree of chemical composition deviation of the surface layer.

The results are shown in Table 1b below. It was found that the chemical composition deviation was very small.

It should be noted that the sintered bodies (oxide evaporation materials) after sintering, including the above-described sintered body for analysis, maintained approximately the same shapes and dimensions as those of the molded bodies.

Moreover, the volume and weight of the sintered bodies (oxide evaporation materials) obtained were measured, and the densities thereof were calculated to be 5.2 to 5.4 g/cm³. Further, from the observation of the fracture surface of the sintered body (oxide evaporation material) using a scanning electron microscope, average values of diameters of 100 crystal grains in the sintered body were determined. All the average values were in the range of 2 to 7 μm. Furthermore, the surface resistance of an electron beam irradiation surface of the sintered body (oxide evaporation material) was measured using a four point probe resistivity meter, and the specific resistance thereof was calculated to be not more than 1 kΩcm.

TABLE 1a

| | Ce/In Atomic Ratio of Oxide Evaporation Material (Feed Composition) | firing Temperature (° C.) firing Time (h) | Sintering Conditions Oxygen Introduction During firing | Atmosphere Adjustment Powder |
|---|---|---|---|---|
| Example: | | | | |
| 1 | 0.0080 | 1250° C., 2 h | present | present |
| Comparative Example: | | | | |
| 1 | 0.0080 | 1250° C., 2 h | present | absent |
| 2 | 0.0080 | 1250° C., 2 h | absent | present |
| 3 | 0.0080 | 1450° C., 8 h | present | absent |
| Example: | | | | |
| 2 | 0.001 | 1250° C., 2 h | present | present |
| 3 | 0.002 | 1250° C., 2 h | present | present |
| 4 | 0.004 | 1250° C., 2 h | present | present |

TABLE 1a-continued

| | Ce/In Atomic Ratio of Oxide Evaporation Material (Feed Composition) | firing Temperature (°C.) firing Time (h) | Sintering Conditions Oxygen Introduction During firing | Atmosphere Adjustment Powder |
|---|---|---|---|---|
| 5 | 0.051 | 1250° C., 2 h | present | present |
| 6 | 0.061 | 1250° C., 2 h | present | present |
| 7 | 0.110 | 1250° C., 2 h | present | present |
| 8 | 0.3460 | 1350° C., 2 h | present | present |
| Comparative Example: | | | | |
| 4 | 0.3460 | 1350° C., 2 h | present | absent |
| 5 | 0.3460 | 1350° C., 2 h | absent | present |
| 6 | 0.3460 | 1450° C., 8 h | present | absent |
| Example: | | | | |
| 9 | 0.0900 | 1350° C., 2 h | present | present |
| 10 | 0.1420 | 1350° C., 2 h | present | present |
| 11 | 0.5380 | 1350° C., 2 h | present | present |

TABLE 1b

| | Chemical Composition of Sintered Body | | |
|---|---|---|---|
| | Surface Ce/In Atomic Ratio (Comp$^5$) | Average Ce/In Atomic Ratio (Comp$^4$) | Comp$^5$/Comp$^4$ |
| Example: | | | |
| 1 | 0.0083 | 0.0079 | 1.05 |
| Comparative Example: | | | |
| 1 | 0.0093 | 0.0081 | 1.15 |
| 2 | 0.0111 | 0.0082 | 1.35 |
| 3 | 0.0145 | 0.0078 | 1.86 |
| Example: | | | |
| 2 | 0.00122 | 0.0012 | 1.02 |
| 3 | 0.00206 | 0.0020 | 1.03 |
| 4 | 0.00414 | 0.0041 | 1.01 |
| 5 | 0.0562 | 0.0511 | 1.10 |
| 6 | 0.0609 | 0.0609 | 1.00 |
| 7 | 0.1156 | 0.1101 | 1.05 |
| 8 | 0.3565 | 0.3461 | 1.03 |
| Comparative Example: | | | |
| 4 | 0.4086 | 0.3463 | 1.18 |
| 5 | 0.5788 | 0.3463 | 1.25 |
| 6 | 0.5404 | 0.3464 | 1.56 |
| Example: | | | |
| 9 | 0.0908 | 0.0899 | 1.01 |
| 10 | 0.1481 | 0.1424 | 1.04 |
| 11 | 0.5109 | 0.5378 | 0.95 |

TABLE 2a

| | Properties of Early Film | | | | | | |
|---|---|---|---|---|---|---|---|
| | | | | | | F | |
| | A | B | C | D | E | G | H |
| Example: | | | | | | | |
| 1 | 0.0083 | crystal | 210 | $3.13 \times 10^{20}$ | 95 | 91 | 85 |
| Comparative Example: | | | | | | | |
| 1 | 0.0090 | crystal | 250 | $2.55 \times 10^{20}$ | 98 | 90 | 83 |
| 2 | 0.0105 | crystal | 250 | $2.87 \times 10^{20}$ | 87 | 91 | 83 |
| 3 | 0.0125 | crystal | 280 | $2.98 \times 10^{20}$ | 75 | 91 | 84 |

TABLE 2a-continued

| | Properties of Early Film | | | | | | |
|---|---|---|---|---|---|---|---|
| | | | | | | F | |
| | A | B | C | D | E | G | H |
| Example: | | | | | | | |
| 2 | 0.0013 | crystal | 410 | $1.84 \times 10^{20}$ | 83 | 91 | 87 |
| 3 | 0.0019 | crystal | 370 | $2.09 \times 10^{20}$ | 81 | 91 | 86 |
| 4 | 0.0042 | crystal | 310 | $2.46 \times 10^{20}$ | 82 | 91 | 85 |
| 5 | 0.0555 | crystal | 350 | $2.23 \times 10^{20}$ | 80 | 91 | 85 |
| 6 | 0.0605 | crystal | 420 | $2.03 \times 10^{20}$ | 74 | 90 | 78 |
| 7 | 0.1103 | crystal | 520 | $1.85 \times 10^{20}$ | 65 | 90 | 76 |

*(Remarks) A: Ce/In Atomic Ratio of Film, B: Crystallinity, C: Specific resistance (μΩcm), D: Carrier Concentration (cm$^{-3}$), E: Hall Mobility (cm$^2$/Vs), F: Transmittance of Film Itself (%), G: Visible Region, H: near-infrared Region TABLE 2b

| | Properties of One-Hour Later Film | | | | | | |
|---|---|---|---|---|---|---|---|
| | | | | | | F | |
| | A | B | C | D | E | G | H |
| Example: | | | | | | | |
| 1 | 0.0082 | crystal | 210 | $3.10 \times 10^{20}$ | 96 | 91 | 85 |
| Comparative Example: | | | | | | | |
| 1 | 0.0084 | crystal | 210 | $3.20 \times 10^{20}$ | 93 | 91 | 85 |
| 2 | 0.0083 | crystal | 210 | $3.13 \times 10^{20}$ | 95 | 91 | 84 |
| 3 | 0.0079 | crystal | 210 | $3.23 \times 10^{20}$ | 92 | 91 | 84 |
| Example: | | | | | | | |
| 2 | 0.0012 | crystal | 410 | $1.86 \times 10^{20}$ | 82 | 91 | 87 |
| 3 | 0.0020 | crystal | 370 | $2.09 \times 10^{20}$ | 81 | 91 | 86 |
| 4 | 0.0041 | crystal | 310 | $2.40 \times 10^{20}$ | 84 | 91 | 85 |
| 5 | 0.0510 | crystal | 350 | $2.18 \times 10^{20}$ | 82 | 91 | 85 |
| 6 | 0.0607 | crystal | 410 | $1.98 \times 10^{20}$ | 77 | 90 | 78 |
| 7 | 0.1100 | crystal | 510 | $1.98 \times 10^{20}$ | 62 | 90 | 76 |

*(Remarks) A: Ce/In Atomic Ratio of Film, B: Crystallinity, C: Specific resistance (μΩcm), D: Carrier Concentration (cm$^{-3}$), E: Hall Mobility (cm$^2$/Vs), F: Transmittance of Film Itself (%), G: Visible Region, H: near-infrared Region

[Preparation of Vapor-Deposited Thin Films (Transparent Conductive films), Evaluation of Film Property, and Evaluation of Deposition]

(1) For the preparation of vapor-deposited thin films (transparent conductive films), a magnetic deflection electron beam evaporator was used.

A evacuation system includes a low evacuation system based on a rotary pump and a high evacuation system based on a cryopump, and can produce a vacuum of down to $5 \times 10^{-5}$ Pa. An electron beam is generated by heating a filament, accelerated by an electric field applied between a cathode and an anode, bent in a magnetic field of a permanent magnet, and then applied to an oxide evaporation material placed in a crucible made of tungsten. The intensity of the electron beam can be adjusted by changing the voltage applied to the filament. Moreover, the beam irradiation position can be changed by changing the acceleration voltage between the cathode and the anode.

Film Formation(Deposition) was carried out under the following conditions.

Ar gas and $O_2$ gas were introduced into a vacuum chamber, and the pressure was maintained at $1.5 \times 10^{-2}$ Pa. At this time, the mixing ratio of Ar gas and $O_2$ gas introduced into the vacuum chamber was changed by adjusting the introduced amount of $O_2$ gas in steps of 1%. For each condition, multiple vapor-deposited thin films (transparent conductive films)

were formed, and the following properties of the vapor-deposited thin film (transparent conductive film) having the smallest specific resistance were evaluated.

Specifically, the circular cylindrical oxide evaporation material (oxide tablet for vapor deposition) of Example 1 was placed in a crucible made of tungsten in an upright position, and the electron beam was applied to a central portion of a circular surface of the oxide evaporation material. Thus, each transparent conductive film having a film thickness of 200 nm was formed on a Corning 7059 glass substrate having a thickness of 1.1 mm. The set voltage and current value of an electron beam gun were 9 kV and 150 mA, respectively, and the substrate was heated to 200° C.

(2) Properties of the vapor-deposited thin films (transparent conductive films) obtained were evaluated using the following procedure.

The surface resistance of each of the vapor-deposited thin films (transparent conductive films) obtained was measured by a four point probe resistivity meter, Loresta EP (manufactured by DIA Instruments Co., Ltd. (now Mitsubishi Chemical Analytech Co., Ltd.), Model MCP-T360). The film thickness thereof was evaluated based on the measurement of a step height between an undeposited portion and a deposited portion using a contact surface roughness meter (manufactured by KLA-Tencor Corporation). Then, the specific resistance thereof was calculated. Further, the following evaluations were performed on the vapor-deposited thin film (transparent conductive film) [hereinafter abbreviated as film in some cases] having the smallest specific resistance.

First, the transmittance $[T_{L+B} (\%)]$ of the film including the glass substrate (of the glass substrate B with the film L) was measured using a spectrophotometer (Hitachi, Ltd., U-4000). From the transmittance $[T_B (\%)]$ of the glass substrate (glass substrate B) alone measured by a same method, the transmittance of the film itself was calculated using the formula $[T_{L+B} \div T_B] \times 100 (\%)$. It should be noted that the average transmittance of the film itself in the visible region was measured at wavelengths of 400 to 800 nm, and that the average transmittance of the film itself in the near-infrared region was measured at wavelengths of 800 to 1200 nm.

Next, the crystallinity of the film was evaluated by X-ray diffraction measurement. Specifically, with X'Pert PRO MPD (manufactured by PANalytical B.V.) used as an X-ray diffractometer, the measurement was performed using Cu Kα radiation at a voltage of 45 kV and a current of 40 mA under broad range measurement conditions. Further, the crystallinity of the film was evaluated based on the presence or absence of X-ray diffraction peaks. Moreover, the chemical composition (Ce/In atomic ratio) of the film was measured by ICP emission spectroscopy. Furthermore, the carrier concentration and Hall mobility of the vapor-deposited thin film (transparent conductive film) were measured at room temperature by the Van der Pauw method using a Hall effect measurement system (manufactured by TOYO Corporation, ResiTest).

Further, the above-described film evaluation was carried out on a film (referred to as "early film") formed within 20 minutes from the start of use of the oxide evaporation material (oxide tablet for vapor deposition) according to Example 1 (start of electron beam irradiation using an electron beam gun) and a film (referred to as "one-hour later film") formed after approximately one hour of continuous use from the start of use thereof. The results are shown in Tables 2a and 2b.

(3) In the oxide evaporation material (oxide tablet for vapor deposition) according to Example 1, the Ce/In atomic ratio ($Comp^S$) in the surface layer was "0.0083," and the average Ce/In atomic ratio ($Comp^A$) of the entire sintered body was "0.0079," as shown in Table 1b. Thus, it was confirmed that the oxide evaporation material has an approximately uniform chemical composition [$Comp^S/Comp^A=1.05$] from the surface of the oxide evaporation material to the interior thereof.

Moreover, as shown in Tables 2a and 2b, the chemical composition of the "early film" was "Ce/In atomic ratio=0.0083," and the chemical composition of the "one-hour later film" was "Ce/In atomic ratio=0.0082. Thus, it was confirmed that the chemical compositions of vapor-deposited thin films (transparent conductive films) obtained using the oxide tablet for vapor deposition according to Example 1 differed little between an early stage of the deposition and a one-hour later stage, and that the same was true of "specific resistance," "carrier concentration," "Hall mobility," and "transmittance."

Such a sintered body tablet for vapor deposition can be utilized as a sintered body tablet for vapor deposition without performing surface grinding on the sintered body after sintering because the chemical composition and properties of the film do not fluctuate and are stable even in early stages of use in which the surface layer of the sintered body is used. In other words, since the sintered body can be used as an evaporation material as it is without grinding a surface layer of the sintered body, advantages are obtained such as low manufacturing cost of the sintered body tablet for vapor deposition. Further, in the case where films are continuously formed for a long period of time while tablets are being continuously fed, films can be continuously formed even when tablets are replaced. Accordingly, the sintered body tablet for vapor deposition is also very advantageous in terms of the productivity of vapor-deposited thin films (transparent conductive films).

Moreover, as shown in Tables 2a and 2b, the vapor-deposited thin film (transparent conductive film) obtained is a crystalline film having a very high Hall mobility, a low resistance, and a high transmittance (91%) in the visible region. Furthermore, because of the low carrier concentration thereof, the film also has an extremely high average transmittance of 85% in the near-infrared region.

Such a vapor-deposited thin film (transparent conductive film) can be said to be very useful as a transparent electrode of a solar cell.

Comparative Example 1

Oxide evaporation materials (oxide tablets for vapor deposition) according to Comparative Example 1 were made under the same conditions as in Example 1 except that the "atmosphere adjustment powder" of Example 1 was not used. In addition, evaluations similar to those in Example 1 were performed. Also, vapor-deposited thin films (transparent conductive films) were formed as in Example 1 using the oxide evaporation material (oxide tablet for vapor deposition) according to Comparative Example 1, and evaluations similar to those in Example 1 were performed.

The results are shown in Tables 1a, 1b, 2a, and 2b above.

It should be noted that the sintered bodies (oxide evaporation materials) after sintering maintained approximately the same shapes and dimensions as those of the molded bodies, as in the case of Example 1. The volumes and weights of the sintered bodies (oxide evaporation materials) obtained were measured, and the densities thereof were calculated to be 5.0 to 5.2 g/cm³.

First, in the oxide evaporation material (oxide tablet for vapor deposition) according to Comparative Example 1, the Ce/In atomic ratio ($Comp^S$) in the surface layer was "0.0093," and the average Ce/In atomic ratio ($Comp^A$) of the entire sintered body was "0.0081," as shown in Table 1b. Thus, the average chemical composition of the entire tablet was approximately the same as the intended composition, but the surface chemical composition of the tablet indicated that the amount of indium was small compared to that in the average chemical composition of the entire tablet.

Moreover, as shown in Tables 2a and 2b, the chemical composition of the "early film" was "Ce/In atomic ratio=0.0090," and the chemical composition of the "one-hour later film" was "Ce/In atomic ratio=0.0084. Thus, it was confirmed that the chemical compositions of vapor-deposited thin films (transparent conductive films) obtained using the oxide tablet for vapor deposition according to Comparative Example 1 differed between an early stage of the deposition and a one-hour later stage, and that electrical properties thereof such as "specific resistance," "carrier concentration," and "Hall mobility" also differed.

In the case where such a sintered body tablet for vapor deposition is used, films having different properties are formed in early stages in which the surface layer of the sintered body is utilized. Accordingly, such a sintered body tablet cannot be utilized for the formation of films. In particular, in mass production in which films are formed for a long period of time while tablets are being continuously fed, properties of films change when tablets are replaced, and therefore such sintered body tablets cannot be used.

To utilize the sintered body in the formation of films, the surface layer, which has a different chemical composition, of the sintered body needs to be removed by grinding the surface of the sintered body. Thus, the manufacturing cost of the sintered body tablet for vapor deposition greatly increases.

Comparative Example 2

Oxide evaporation materials (oxide tablets for vapor deposition) according to Comparative Example 2 were made under the same conditions as in Example 1, except that oxygen was not introduced during the firing of molded bodies. In addition, evaluations similar to those in Example 1 were performed. Also, vapor-deposited thin films (transparent conductive films) were formed as in Example 1 using the oxide evaporation material (oxide tablet for vapor deposition) according to Comparative Example 2, and evaluations similar to those in Example 1 were performed.

The results are shown in Tables 1a, 1b, 2a, and 2b above.

It should be noted that the sintered bodies (oxide evaporation materials) after sintering maintained approximately the same shapes and dimensions as those of the molded bodies, as in the case of Example 1. The volumes and weights of the sintered bodies (oxide evaporation materials) obtained were measured, and the densities thereof were calculated to be 4.9 to 5.1 g/cm$^3$.

First, in the oxide evaporation material (oxide tablet for vapor deposition) according to Comparative Example 2, the Ce/In atomic ratio (Comp$^S$) in the surface layer was "0.0111," and the average Ce/In atomic ratio (Comp$^4$) of the entire sintered body was "0.0082," as shown in Table 1b. Thus, the average chemical composition of the entire tablet was approximately the same as the intended composition, but the surface chemical composition of the tablet indicated that the amount of indium was small compared to that in the average chemical composition of the entire tablet.

Moreover, as shown in Tables 2a and 2b, the chemical composition of the "early film" was "Ce/In atomic ratio=0.0105," and the chemical composition of the "one-hour later film" was "Ce/In atomic ratio=0.0083. Thus, it was confirmed that the chemical compositions of vapor-deposited thin films (transparent conductive films) obtained using the oxide tablet for vapor deposition according to Comparative Example 2 differed between an early stage of the deposition and a one-hour later stage, and that electrical properties thereof such as "specific resistance," "carrier concentration," and "Hall mobility" also differed.

In the case where such a sintered body tablet for vapor deposition is used, films having different properties are formed in early stages in which the surface layer of the sintered body is utilized. Accordingly, such a sintered body tablet cannot be utilized for the formation of films. In particular, in mass production in which films are formed for a long period of time while tablets are being continuously fed, properties of films change when tablets are replaced, and therefore such sintered body tablets cannot be used.

To utilize the sintered body in the formation of films, the surface layer, which has a different chemical composition, of the sintered body needs to be removed by grinding the surface of the sintered body. Thus, the manufacturing cost of the sintered body tablet for vapor deposition greatly increases.

Comparative Example 3

Next, a cerium-containing indium oxide sintered body was made according to the technique for making a sintered body as a sputtering target disclosed in Japanese Patent Application Publication No. 2005-290458 (Patent Document 4).

First, an $In_2O_3$ powder having an average particle diameter of not more than 1 μm and a $CeO_2$ powder having an average particle diameter of not more than 1 μm were used as raw material powders. The $In_2O_3$ and $CeO_2$ powders were blended in such a manner that the Ce/In atomic ratio was 0.008. The blend was put into a resin pot, and mixed by a wet ball mill. Here, hard $ZrO_2$ balls were used, and the mixing time was 20 hours. After the mixing, a slurry was taken out, filtered, and dried to be granulated. Further, the granulated powder obtained was molded by cold isostatic pressing with a pressure of 3 t/cm$^2$.

The molded body obtained was placed in a sintering furnace, and an atmosphere was produced by introducing oxygen into the furnace at a rate of 5 liters/min for every 0.1 m$^3$ of the furnace volume. At 1450° C., sintering was performed for 8 hours. At this time, the temperature was raised to 1000° C. at 1° C./min, and raised from 1000 to 1450° C. at 2° C./min. After that, oxygen introduction was stopped, and the temperature was reduced from 1450 to 1300° C. at 5° C./min. Further, a temperature of 1300° C. was maintained for 3 hours in an atmosphere in which argon gas was being introduced into the furnace at a rate of 10 liters/min for every 0.1 m$^3$ of the furnace volume, followed by natural cooling.

After firing, the sintered body was shrunk to a circular cylindrical shape having a size of 28 mm in diameter and 36 mm in thickness. Moreover, the density, specific resistance, and crystal grain diameters of the sintered body were 6.4 g/cm$^3$, 0.8 mΩcm, and 10 to 15 μm, respectively. Further, the results of measuring and evaluating the surface chemical composition of the sintered body and the average chemical composition of the entire sintered body as in Example 1 are shown in Table 1b.

As shown in Table 1b, the Ce/In atomic ratio (Comp$^S$) in the surface layer was "0.0145," and the average Ce/In atomic ratio (Comp$^4$) of the entire sintered body was "0.0078." Thus, the average chemical composition of the entire sintered body was approximately the same as the feed composition, but the surface chemical composition of the sintered body indicated that the amount of indium was small compared to that in the average chemical composition of the entire sintered body.

Moreover, the evaluation of deposition was carried out as in Example 1. The results are shown in Tables 2a and 2b.

Further, as shown in Tables 2a and 2b, the chemical composition of the "early film" was "Ce/In atomic ratio=0.0125," and the chemical composition of the "one-hour later film"

was "Ce/In atomic ratio=0.0079." Thus, it was confirmed that the chemical compositions of vapor-deposited thin films (transparent conductive films) obtained using the sintered body tablet according to Comparative Example 3 differed between an early stage of the deposition and a one-hour later stage, and that electrical properties thereof such as "specific resistance," "carrier concentration," and "Hall mobility" also differed.

In the case where such a sintered body tablet is used, films having different properties are formed in early stages in which the surface layer of the sintered body is utilized. Accordingly, such a sintered body tablet cannot be utilized for the formation of films. In particular, in mass production in which films are formed for a long period of time while tablets are being continuously fed, properties of films change when tablets are replaced, and therefore such sintered body tablets cannot be used.

To utilize the sintered body in the formation of films, the surface layer, which has a different chemical composition, of the sintered body needs to be removed by grinding the surface of the sintered body. Thus, the manufacturing cost of the sintered body tablet for vapor: deposition greatly increases.

Examples 2 to 7

Sintered bodies (oxide tablets for vapor deposition) were prepared under the same conditions as in Example 1, except that when $In_2O_3$ and $CeO_2$ powders as raw materials were blended, the $In_2O_3$ and $CeO_2$ powders were blended in such a manner that the Ce/In atomic ratio was 0.001 (Example 2), 0.002 (Example 3), 0.004 (Example 4), 0.051 (Example 5), 0.061 (Example 6), or 0.110 (Example 7).

Further, for each of the examples, an evaluation was carried out on the surface chemical composition of the sintered body and the average chemical composition of the entire sintered body after firing, and the following results were obtained: $Comp^S/Comp^A$=0.9 to 1.1; and the surface chemical composition of the sintered body was approximately the same as the average chemical composition of the entire sintered body, and was approximately the same as the feed chemical composition. The volumes and weights of the sintered bodies (oxide evaporation materials) were measured, and the densities thereof were calculated to be 4.9 to 5.4 g/cm$^3$.

Moreover, properties of films formed using the sintered bodies (oxide tablets for vapor deposition) obtained were also evaluated as in Example 1. The results are shown in Tables 2a and 2b.

Further, as shown in Tables 2a and 2b, the "early film" and the "one-hour later film" have almost the same chemical compositions and electrical properties such as "specific resistance," "carrier concentration," and "Hall mobility."

Such sintered body tablets for vapor deposition can be used as sintered body tablets for vapor deposition without performing surface grinding on the sintered bodies after sintering because the chemical compositions and properties of the films do not fluctuate and are stable even in early stages of use in which the surface layer of each sintered body is utilized. In other words, since the sintered bodies can be used as evaporation materials as they are without grinding a surface layer of each sintered body, advantages are obtained such as low manufacturing cost of the sintered body tablets for vapor deposition. Further, in the case where films are continuously formed for a long period of time while tablets are being continuously fed, films can be continuously formed even when tablets are replaced. Accordingly, the sintered body tablets for vapor deposition are also very advantageous in terms of the productivity of vapor-deposited thin films (transparent conductive films).

Next, properties of the vapor-deposited thin films (transparent conductive films) obtained in examples 1 to 7, including Example 1, are compared. With regard to crystalline films (crystalline films of examples 1, 4, and 5, based on the data shown in Tables 2a and 2b) containing indium oxide as a main component and containing cerium at a Ce/In atomic ratio of 0.004 to 0.056, transparent conductive films were successfully obtained each of which had a Hall mobility of not less than 80 cm$^2$/V·s, a carrier concentration of not more than $3.3 \times 10^{20}$ cm$^{-3}$, and a specific resistance of not more than $3.5 \times 10^{-4}$ Ωcm. The films each had an extremely high average transmittance of 80% or more at wavelengths of 800 to 1200 nm.

Such vapor-deposited thin films (transparent conductive films) can be said to be very useful as transparent electrodes of solar cells.

Example 8

Sintered bodies (oxide tablets for vapor deposition) were prepared under the same conditions as in Example 1, except that when $In_2O_3$ and $CeO_2$ powders were blended, the $In_2O_3$ and $CeO_2$ powders were blended in such a manner that the Ce/In atomic ratio was 0.346, and that the sintering temperature and time were respectively set to 1350° C. and 2 hours. The volumes and weights of the sintered bodies (oxide evaporation materials) obtained were measured, and the densities thereof were calculated to be 5.2 to 5.4 g/cm$^3$.

Further, an evaluation was carried out on the surface chemical composition of the sintered body and the average chemical composition of the entire sintered body after firing, and the following results were obtained: $Comp^S/Comp^A$=1.03; and the surface chemical composition of the sintered body was approximately the same as the average chemical composition of the entire sintered body, and was approximately the same as the feed chemical composition.

Next, a deposition test was carried out by the same method as in Example 1, except that the sintered body obtained was used as an oxide tablet for vapor deposition, and that the substrate was not heated during deposition. In the case where the amount of oxygen was small during deposition, the vapor-deposited thin film became colored. An increase in the amount of oxygen increased transparency. Further, the amount of oxygen with which the transparency was maximum was regarded as an optimum condition, and the refractive index of a vapor-deposited thin film obtained under the condition at a wavelength of 550 nm was measured using an ellipsometer. Moreover, the transmittance of the film itself in the visible region was determined as in Example 1. The results are shown in Tables 3a and 3b below.

TABLE 3a

| | Properties of Early Film | | | |
|---|---|---|---|---|
| | A | B | C | D |
| Example: | | | | |
| 8 | 0.3484 | Amorphous | 2.42 | 91 |
| Comparative Example: | | | | |
| 4 | 0.3938 | Amorphous | 2.45 | 90 |
| 5 | 0.5342 | Amorphous | 2.50 | 91 |
| 6 | 0.5124 | Amorphous | 2.49 | 91 |

TABLE 3a-continued

Properties of Early Film

| | A | B | C | D |
|---|---|---|---|---|
| Example: | | | | |
| 9 | 0.0901 | Amorphous | 2.15 | 91 |
| 10 | 0.1478 | Amorphous | 2.20 | 91 |
| 11 | 0.5205 | Amorphous | 2.52 | 91 |

*(Remarks) A: Ce/In Atomic Ratio of the Film, B: Crystallinity, C: Refractive Index at a Wavelength of 550 nm, D: Transmittance of the Film Itself in the Visible Region (%)

TABLE 3b

Properties of One-Hour Later Film

| | A | B | C | D |
|---|---|---|---|---|
| Example: | | | | |
| 8 | 0.3489 | Amorphous | 2.42 | 91 |
| Comparative Example: | | | | |
| 4 | 0.3485 | Amorphous | 2.42 | 90 |
| 5 | 0.3467 | Amorphous | 2.42 | 91 |
| 6 | 0.3473 | Amorphous | 2.42 | 91 |
| Example: | | | | |
| 9 | 0.0900 | Amorphous | 2.15 | 91 |
| 10 | 0.1436 | Amorphous | 2.20 | 91 |
| 11 | 0.5375 | Amorphous | 2.52 | 91 |

*(Remarks) A: Ce/In Atomic Ratio of the Film, B: Crystallinity, C: Refractive Index at a Wavelength of 550 nm, D: Transmittance of the Film Itself in the Visible Region (%)

Data shown in Tables 3a and 3b indicates that vapor-deposited thin films obtained in early stages of use of the oxide tablet for vapor deposition and vapor-deposited thin films obtained one hour later (the former are referred to as "early films," and the latter are referred to as "one-hour later films") had almost the same chemical compositions and optical properties (refractive index and transmittance). Moreover, the evaluation of crystallinity by X-ray diffraction measurement proved that each of the vapor-deposited thin films was an amorphous film.

Such a sintered body tablet for vapor deposition can be used as a sintered body tablet for vapor deposition without performing surface grinding on the sintered body after sintering because the chemical composition and properties of the film do not fluctuate and are stable even in early stages of use in which the surface layer of the sintered body is utilized. In other words, since the sintered body can be used as an evaporation material as it is without grinding a surface layer of the sintered body, advantages are obtained such as low manufacturing cost of the sintered body tablet for vapor deposition. Further, in the case where films are continuously formed for a long period of time while tablets are being continuously fed, films can be continuously formed even when tablets are replaced. Accordingly, the sintered body tablet for vapor deposition is also very advantageous in terms of the productivity of vapor-deposited thin films (transparent conductive films).

Next, the refractive index of the vapor-deposited thin film obtained at a wavelength of 550 nm was "2.42" as shown in Tables 3a and 3b, and was a high value compared to those of conventional indium oxide-based thin films (e.g., 1.9 to 2.1 in ITO films). Accordingly, the vapor-deposited thin film is very advantageous when an optical component (e.g., antireflection film or the like) in which the effect of interference of light is exerted is made as a stacked body by combining the vapor-deposited thin film with a low-refractive-index film with a refractive index of 1.3 to 1.5 in the visible region, such as a silicon oxide film or a metal fluoride film.

Comparative Example 4

Oxide evaporation materials (oxide tablets for vapor deposition) according to Comparative Example 4 were made under the same conditions as in Example 8, except that the "atmosphere adjustment powder" of Example 8 was not used. In addition, evaluations similar to those in Example 8 were performed. Also, vapor-deposited thin films were formed as in Example 8 using the oxide evaporation material (oxide tablet for vapor deposition) according to Comparative Example 4, and evaluations similar to those in Example 8 were performed.

The results are shown in Tables 1a, 1b, 3a, and 3b above.

It should be noted that the sintered bodies (oxide evaporation materials) after sintering maintained approximately the same shapes and dimensions as those of the molded body, as in the case of Example 8. The volumes and weights of the sintered bodies (oxide evaporation materials) were measured, and the densities thereof were calculated to be 5.0 to 5.1 $g/cm^3$.

First, in the oxide evaporation material (oxide tablet for vapor deposition) according to Comparative Example 4, the Ce/In atomic ratio ($Comp^S$) in the surface layer was "0.4086," and the average Ce/In atomic ratio ($Comp^4$) of the entire sintered body was "0.3463," as shown in Table 1b. Thus, the average chemical composition of the entire tablet was approximately the same as the intended composition, but the surface chemical composition of the tablet indicated that the amount of indium was small compared to that in the average chemical composition of the entire tablet.

Moreover, as shown in Tables 3a and 3b, the chemical composition of the "early film" was "Ce/In atomic ratio=0.3938," and the chemical composition of the "one-hour later film" was "Ce/In atomic ratio=0.3485. Thus, it was confirmed that the chemical compositions of vapor-deposited thin films obtained using the oxide tablet for vapor deposition according to Comparative Example 4 differed between an early stage of the deposition and a one-hour later stage, and that optical properties thereof (refractive index) also differed.

In the case where such a sintered body tablet for vapor deposition is used, films having different properties are formed in early stages in which the surface layer of the sintered body is utilized. Accordingly, such a sintered body tablet cannot be utilized for the formation of films. In particular, in mass production in which films are formed for a long period of time while tablets are being continuously fed, properties of films change when tablets are replaced, and therefore such sintered body tablets cannot be used.

To utilize the sintered body in the formation of films, the surface layer, which has a different chemical composition, of the sintered body needs to be removed by grinding the surface of the sintered body. Thus, the manufacturing cost of the sintered body tablet for vapor deposition greatly increases.

Comparative Example 5

Oxide evaporation materials (oxide tablets for vapor deposition) according to Comparative Example 5 were made under the same conditions as in Example 8, except that oxygen was not introduced during the firing of molded bodies. In addition, evaluations similar to those in Example 8 were performed. Also, vapor-deposited thin films were formed as in Example 8 using the oxide evaporation material (oxide tablet for vapor deposition) according to Comparative Example 5, and evaluations similar to those in Example 8 were performed.

The results are shown in Tables 1a, 1b, 3a, and 3b above.

It should be noted that the sintered bodies (oxide evaporation materials) after sintering maintained approximately the same shapes and dimensions as those of the molded bodies, as in the case of Example 8. Moreover, the volumes and weights of the sintered bodies (oxide evaporation materials) were measured, and the densities thereof were calculated to be 4.9 to 5.0 g/cm$^3$.

First, in the oxide evaporation material (oxide tablet for vapor deposition) according to Comparative Example 5, the Ce/In atomic ratio (Comp$^S$) in the surface layer was "0.5788," and the average Ce/In atomic ratio (Comp$^A$) of the entire sintered body was "0.3463," as shown in Table 1b. Thus, the average chemical composition of the entire tablet was approximately the same as the intended composition, but the surface chemical composition of the tablet indicated that the amount of indium was small compared to that in the average chemical composition of the entire tablet.

Moreover, as shown in Tables 3a and 3b, the chemical composition of the "early film" was "Ce/In atomic ratio=0.5342," and the chemical composition of the "one-hour later film" was "Ce/In atomic ratio=0.3467. Thus, it was confirmed that the chemical compositions of vapor-deposited thin films obtained using the oxide tablet for vapor deposition according to Comparative Example 5 differed between an early stage of the deposition and a one-hour later stage, and that optical properties thereof (refractive index) also differed.

In the case where such a sintered body tablet for vapor deposition is used, films having different properties are formed in early stages in which the surface layer of the sintered body is utilized. Accordingly, such a sintered body tablet cannot be utilized for the formation of films. In particular, in mass production in which films are formed for a long period of time while tablets are being continuously fed, properties of films change when tablets are replaced, and therefore such sintered body tablets cannot be used.

To utilize the sintered body in the formation of films, the surface layer, which has a different chemical composition, of the sintered body needs to be removed by grinding the surface of the sintered body. Thus, the manufacturing cost of the sintered body tablet for vapor deposition greatly increases.

Comparative Example 6

Next, as in the case of Comparative Example 3, a cerium-containing indium oxide sintered body was made according to the technique for manufacturing a sintered body as a sputtering target disclosed in Japanese Patent Application Publication No. 2005-290458 (Patent Document 4).

First, an In$_2$O$_3$ powder having an average particle diameter of not more than 1 μm and a CeO$_2$ powder having an average particle diameter of not more than 1 μm were used as raw material powders. The In$_2$O$_3$ and CeO$_2$ powders were blended in such a manner that the Ce/In atomic ratio was 0.3460. The blend was put into a resin pot, and mixed by a wet ball mill. Here, hard ZrO$_2$ balls were used, and the mixing time was 20 hours. After the mixing, a slurry was taken out, filtered, and dried to be granulated. Further, the granulated powder obtained was molded by cold isostatic pressing with a pressure of 3 t/cm$^2$.

The molded body obtained was placed in a sintering furnace, and an atmosphere was produced by introducing oxygen into the furnace at a rate of 5 liters/min for every 0.1 m$^3$ of the furnace volume. At 1450° C., sintering was performed for 8 hours. At this time, the temperature was raised to 1000° C. at 1° C./min, and raised from 1000 to 1450° C. at 2° C./min. After that, oxygen introduction was stopped, and the temperature was reduced from 1450 to 1300° C. at 5° C./min. Further, a temperature of 1300° C. was maintained for 3 hours in an atmosphere in which argon gas was being introduced into the furnace at a rate of 10 liters/min for every 0.1 m$^3$ of the furnace volume, followed by natural cooling.

After firing, the sintered body was shrunk to a circular cylindrical shape having a size of 27 mm in diameter and 35 mm in thickness. Moreover, the density, specific resistance, and crystal grain diameters of the sintered body were 6.1 g/cm$^3$, 1.0 mΩcm, and 10 to 15 μm, respectively. Further, the results of measuring and evaluating the surface chemical composition of the sintered body and the average chemical composition of the entire sintered body as in Example 8 are shown in Tables 1a and 1b.

As shown in Table 1b, the Ce/In atomic ratio (Comp$^S$) in the surface layer was "0.5404," and the average Ce/In atomic ratio (Comp$^A$) of the entire sintered body was "0.3464." Thus, the average chemical composition of the entire sintered body was approximately the same as the feed composition, but the surface chemical composition of the sintered body indicated that the amount of indium was small compared to that in the average chemical composition of the entire sintered body.

Moreover, the evaluation of deposition was carried out as in Example 8. The results are shown in Tables 3a and 3b.

Further, as shown in Tables 3a and 3b, the chemical composition of the "early film" was "Ce/In atomic ratio=0.5124," and the chemical composition of the "one-hour later film" was "Ce/In atomic ratio=0.3473. Thus, it was confirmed that the chemical compositions of vapor-deposited thin films obtained using the sintered body tablet according to Comparative Example 6 differed between an early stage of the deposition and a one-hour later stage, and that optical properties thereof (refractive index) also differed.

In the case where such a sintered body tablet for vapor deposition is used, films having different properties are formed in early stages in which the surface layer of the sintered body is utilized. Accordingly, such a sintered body tablet cannot be utilized for the formation of films. In particular, in mass production in which films are formed for a long period of time while tablets are being continuously fed, properties of films change when tablets are replaced, and therefore such sintered body tablets cannot be used.

To utilize the sintered body in the formation of films, the surface layer, which has a different chemical composition, of the sintered body needs to be removed by grinding the surface of the sintered body. Thus, the manufacturing cost of the sintered body tablet for vapor deposition greatly increases.

Examples 9 to 11

Sintered bodies (oxide tablets for vapor deposition) were prepared under the same conditions as in Example 8, except that when In$_2$O$_3$ and CeO$_2$ powders as raw materials were blended, the In$_2$O$_3$ and CeO$_2$ powders were blended in such a manner that the Ce/In atomic ratio was 0.090 (Example 9), 0.142 (Example 10), or 0.538 (Example 11).

The volumes and weights of the sintered bodies (oxide evaporation materials) obtained were measured, and the densities thereof were calculated to be 4.9 to 5.4 g/cm$^3$. Further, for each of the examples, an evaluation was carried out on the surface chemical composition of the sintered body and the average chemical composition of the entire sintered body after firing, and the following results were obtained: as shown in Tables 1a and 1b, Comp$^S$/Comp$^A$=0.9 to 1.1; and the surface chemical composition of the sintered body was approximately the same as the average chemical composition of the entire sintered body, and was approximately the same as the feed chemical composition.

Moreover, properties of films formed using the sintered bodies (oxide tablets for vapor deposition) obtained were also evaluated as in Example 8. The results are shown in Tables 3a and 3b.

Data shown in Tables 3a and 3b indicates that vapor-deposited thin films obtained in early stages of use of the oxide tablets for vapor deposition and vapor-deposited thin films obtained one hour later (the former are referred to as "early films," and the latter are referred to as "one-hour later films") have almost the same chemical compositions and optical properties (refractive index and transmittance). Moreover, the evaluation of crystallinity by X-ray diffraction measurement proved that each of the vapor-deposited thin films was an amorphous film.

Such sintered body tablets for vapor deposition can be used as sintered body tablets for vapor deposition without performing surface grinding on the sintered bodies after sintering because the chemical compositions and properties of the films do not fluctuate and are stable even in early stages of use in which the surface layer of each sintered body is utilized. In other words, since the sintered bodies can be used as evaporation materials as they are without grinding a surface layer of each sintered body, advantages are obtained such as low manufacturing cost of the sintered body tablets for vapor deposition. Further, in the case where films are continuously formed for a long period of time while tablets are being continuously fed, films can be continuously formed even when tablets are replaced. Accordingly, the sintered body tablets for vapor deposition are also very advantageous in terms of the productivity of vapor-deposited thin films (transparent conductive films).

Next, the refractive indices of the obtained vapor-deposited thin films according to examples 9 to 11 at a wavelength of 550 nm are "2.15 to 2.52" as shown in Tables 3a and 3b, and are high values compared to those of conventional indium oxide-based thin films (e.g., 1.9 to 2.1 in ITO films). Accordingly, each of the vapor-deposited thin films is very advantageous when an optical component (e.g., antireflection film or the like) in which the effect of interference of light is exerted is made as a stacked body by combining the vapor-deposited thin film with a low-refractive-index film with a refractive index of 1.3 to 1.5 in the visible region, such as a silicon oxide film or a metal fluoride film.

POSSIBILITY OF INDUSTRIAL APPLICATION

The oxide tablet for vapor deposition (oxide evaporation material) according to the present invention comprising a sintered body having a surface chemical composition which is approximately the same as the chemical composition of the interior thereof can be used as it is as an evaporation material without performing surface grinding on the sintered body. Accordingly, manufacturing cost can be reduced. Also, since the tablet can be utilized for the formation of thin films even in early stages of use thereof, the amount of production of thin films per tablet can be increased. Thus, the tablet has such industrial applicability as to be utilized as an oxide tablet for vapor deposition for forming transparent electrodes of various kinds of solar cells or an oxide tablet for vapor deposition for constructing an antireflection film or the like in combination with a low-refractive-index film.

The invention claimed is:

1. An oxide evaporation material comprising a sintered body which contains indium oxide as a main component and cerium and which is subjected to no surface grinding after sintering,
wherein $Comp^S/Comp^A=0.9$ to $1.1$,
where the content of cerium in a surface layer to a depth of 5 μm from a surface of the sintered body is represented by a Ce/In atomic ratio ($Comp^S$), and an average value of the content of cerium in the entire sintered body is represented by a Ce/In atomic ratio ($Comp^A$).

2. The oxide evaporation material according to claim 1, wherein the average value, Ce/In atomic ratio ($Comp^A$), of the content of cerium in the entire sintered body is 0.001 to 0.538.

3. The oxide evaporation material according to claim 1, wherein the sintered body has a circular cylindrical shape.

4. A vapor-deposited thin film containing indium oxide as a main component and cerium, wherein the vapor-deposited thin film is formed by any one of electron beam deposition, ion plating, and high-density plasma-assist evaporation, using the oxide evaporation material according to claim 1 as a raw material, and an average value of the content of cerium in the thin film formed is 0.001 to 0.538 in terms of Ce/In atomic ratio.

5. The vapor-deposited thin film according to claim 4, comprising an electrically-conductive transparent crystalline film in which the average value of the content of cerium in the thin film formed is 0.004 to 0.056 in terms of Ce/In atomic ratio and which has a specific resistance of not more than $3.5 \times 10^{-4}$ Ωcm.

6. The vapor-deposited thin film according to claim 5, comprising an electrically-conductive transparent crystalline film having a Hall mobility of not less than 80 cm$^2$/V·s and a carrier concentration of not more than $3.3 \times 10^{20}$ cm$^{-3}$.

7. The vapor-deposited thin film according to claim 4, wherein the film has an average transmittance of not less than 80% at wavelength of 800 to 1200 nm.

8. A solar cell comprising an electrode formed of the vapor-deposited thin film according to claim 4.

9. The vapor-deposited thin film according to claim 4, comprising a high-refractive-index transparent film in which the average value of the content of cerium in the thin film formed is 0.090 to 0.538 in terms of Ce/In atomic ratio and which has a refractive index of not less than 2.15 at a wavelength of 550 nm.

10. The oxide evaporation material according to claim 2, wherein the sintered body has a circular cylindrical shape.

11. A vapor-deposited thin film containing indium oxide as a main component and cerium, wherein the vapor-deposited thin film is formed by any one of electron beam deposition, ion plating, and high-density plasma-assist evaporation, using the oxide evaporation material according to claim 2 as a raw material, and an average value of the content of cerium in the thin film formed is 0.001 to 0.538 in terms of Ce/In atomic ratio.

12. The vapor-deposited thin film according to claim 11, comprising an electrically-conductive transparent crystalline film in which the average value of the content of cerium in the thin film formed is 0.004 to 0.056 in terms of Ce/In atomic ratio and which has a specific resistance of not more than $3.5 \times 10^{-4}$ Ωcm.

13. The vapor-deposited thin film according to claim 12, comprising an electrically-conductive transparent crystalline film having a Hall mobility of not less than 80 cm$^2$/V·s and a carrier concentration of not more than $3.3 \times 10^{20}$ cm$^{-3}$.

14. The vapor-deposited thin film according to claim 11, wherein the film has an average transmittance of not less than 80% at wavelength of 800 to 1200 nm.

15. A solar cell comprising an electrode formed of the vapor-deposited thin film according to claim 11.

16. The vapor-deposited thin film according to claim 11, comprising a high-refractive-index transparent film in which the average value of the content of cerium in the thin film formed is 0.090 to 0.538 in terms of Ce/In atomic ratio and which has a refractive index of not less than 2.15 at a wavelength of 550 nm.

* * * * *